United States Patent
Baek et al.

(10) Patent No.: US 7,791,923 B2
(45) Date of Patent: Sep. 7, 2010

(54) MULTI-STATE RESISTIVE MEMORY ELEMENT, MULTI-BIT RESISTIVE MEMORY CELL, OPERATING METHOD THEREOF, AND DATA PROCESSING SYSTEM USING THE MEMORY ELEMENT

(75) Inventors: In-Gyu Baek, Seoul (KR); Dong-Chul Kim, Gyeonggi-do (KR); Jang-Eun Lee, Gyeonggi-do (KR); Myoung-Jae Lee, Gyeonggi-do (KR); Sun-Ae Seo, Gyeonggi-do (KR); Hyeong-Jun Kim, Seoul (KR); Seung-Eon Ahn, Gyeonggi-do (KR); Eun-Kyung Yim, Daegu-Gwangyeoksi (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/619,522

(22) Filed: Jan. 3, 2007

(65) Prior Publication Data

US 2007/0159869 A1 Jul. 12, 2007

(30) Foreign Application Priority Data

Jan. 9, 2006 (KR) ...................... 10-2006-0002300

(51) Int. Cl.
*G11C 11/00* (2006.01)
(52) U.S. Cl. .................. 365/148; 365/158; 365/71; 365/87; 365/100; 365/103; 365/114; 365/189.16; 365/174; 257/202
(58) Field of Classification Search ................. 365/148, 365/158; 257/202
See application file for complete search history.

(56) References Cited

U.S. PATENT DOCUMENTS

| | | | |
|---|---|---|---|
| 6,664,117 B2 | 12/2003 | Zhuang et al. | |
| 6,829,162 B2 | 12/2004 | Hosotani | |
| 2003/0148545 A1 | 8/2003 | Zhuang et al. | |
| 2004/0160804 A1 | 8/2004 | Rinerson et al. | |
| 2004/0257854 A1 | 12/2004 | Chen et al. | |
| 2005/0035373 A1* | 2/2005 | Ishida et al. | ................ 257/202 |

(Continued)

FOREIGN PATENT DOCUMENTS

CN 1641879 A 7/2005

(Continued)

OTHER PUBLICATIONS

Baek etal., Highly scalable non-volatile resistive memory using simple binary oxide driven by asymmetric unipolar volatge pulses, 2004, IEDM, pp. 1-4.*

(Continued)

*Primary Examiner*—Huan Hoang
*Assistant Examiner*—Fernando N Hidalgo
(74) *Attorney, Agent, or Firm*—Myers Bigel Sibley & Sajovec, PA

(57) ABSTRACT

A multi-bit memory cell stores information corresponding to a high resistive state and multiple other resistive states lower than the high resistive state. A resistance of a memory element within the multi-bit memory cell switches from the high resistive state to one of the other multiple resistive states by applying a corresponding current to the memory element.

17 Claims, 5 Drawing Sheets

U.S. PATENT DOCUMENTS

| | | |
|---|---|---|
| 2005/0097257 A1 | 5/2005 | Ishida et al. |
| 2005/0121697 A1 | 6/2005 | Ishida et al. |
| 2005/0174840 A1 | 8/2005 | Tsushima et al. |
| 2005/0285096 A1 | 12/2005 | Kozicki |
| 2006/0104106 A1 | 5/2006 | Aratani et al. |
| 2006/0126423 A1 | 6/2006 | Aratani et al. |
| 2006/0263289 A1 | 11/2006 | Heo et al. |

FOREIGN PATENT DOCUMENTS

| | | | |
|---|---|---|---|
| DE | 69900946 T | * | 6/2002 |
| DE | 10 2004 016 13 | | 10/2005 |
| DE | 102004016131 | * | 10/2005 |
| EP | 1 484 799 | | 12/2004 |
| EP | 1 686 624 | | 8/2006 |
| JP | 2003-179213 | | 6/2003 |
| JP | 2005-235360 | | 9/2005 |
| KR | 2003-0048351 | | 6/2003 |
| KR | 2005-0076686 | | 7/2005 |

OTHER PUBLICATIONS

English language abstract of Korean Publication No. 2003-0048351.
English language abstract of Korean Publication No. 2005-0076686.
English language abstract of Japanese Publication No. 2003-179213.
English language abstract of Japanese Publication No. 2005-235360.

* cited by examiner

MULTI-STATE RESISTIVE MEMORY ELEMENT, MULTI-BIT RESISTIVE MEMORY CELL, OPERATING METHOD THEREOF, AND DATA PROCESSING SYSTEM USING THE MEMORY ELEMENT

CROSS-REFERENCE TO RELATED APPLICATIONS

This application claims the benefit of foreign priority to Korean Patent Application No. 2006-02300, filed on Jan. 9, 2006, the entire contents of which are hereby incorporated by reference.

BACKGROUND

1. Technical Field

Embodiments exemplarily described herein relate generally to semiconductor memory devices and more particularly to resistive memory elements.

2. Description of the Related Art

Recently, techniques of forming memory devices that use a material having a resistance that is reversibly switchable between two resistive states have been proposed. Colossal magneto-resistance (CMR) material is known to be switchable between low and high resistive states in response to a voltage pulse applied thereto. For example, if a positive voltage pulse is applied to CMR material exhibiting a high resistive state, the CMR material responds by exhibiting a low resistive state. If a negative voltage pulse is applied to the CMR material exhibiting a low resistive state, the CMR material responds by exhibiting a high resistive state. When many voltage pulses of one polarity are applied to the CMR material, the CMR material responds by gradually changing resistive states and gradually returns to its original resistive state when voltage pulses of an opposite polarity are applied thereto. Based upon these response characteristics described above, CMR material poses many challenges that must be overcome to form an advanced multi-bit memory device capable of storing more two bits in a single memory cell.

SUMMARY

One embodiment exemplarily described herein can be characterized as a memory element of a multi-bit memory cell, wherein the memory element includes a binary metal oxide film, wherein a resistance of the binary metal oxide film is switchable from a first resistive state to a corresponding one of a plurality of other resistive states in response to a current applied thereto, and wherein a resistance of the first resistive state is higher than a resistance of each of the plurality of other resistive states.

Another embodiment exemplarily described herein can be characterized as a multi-bit memory cell that includes: a memory element, wherein a resistance of the memory element is switchable from a first resistive state to a corresponding one of a plurality of other resistive states in response to a current applied thereto, wherein a resistance of the first resistive state is higher than a resistance of each of the plurality of other resistive states and wherein the memory element comprises metal oxide; a first electrode contacting the metal oxide; and a second electrode contacting metal oxide, wherein the first and second electrodes are adapted to apply the current to the memory element.

Yet another embodiment exemplarily described herein can be characterized as a multi-bit memory cell that includes a metal oxide film, wherein a resistance of the metal oxide film is switchable from a first resistive state to a corresponding one of a plurality of other resistive states in response to a current applied thereto, wherein a resistance of the first resistive state is higher than a resistance of each of the plurality of other resistive states; a first electrode contacting the metal oxide film; and a second electrode contacting metal oxide film, wherein the first and second electrodes are adapted to apply the current to the metal oxide film.

Still another embodiment exemplarily described herein can be characterized as a method of operating a multi-bit memory cell, wherein the method includes applying a current to a binary metal oxide memory cell, the applied current sufficient to switch a resistance of the binary metal oxide memory cell from a first resistive state to a corresponding one of a plurality of other resistive states, and wherein a resistance of the first resistive state is higher than a resistance of each of the plurality of other resistive states.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION

Figure 1:
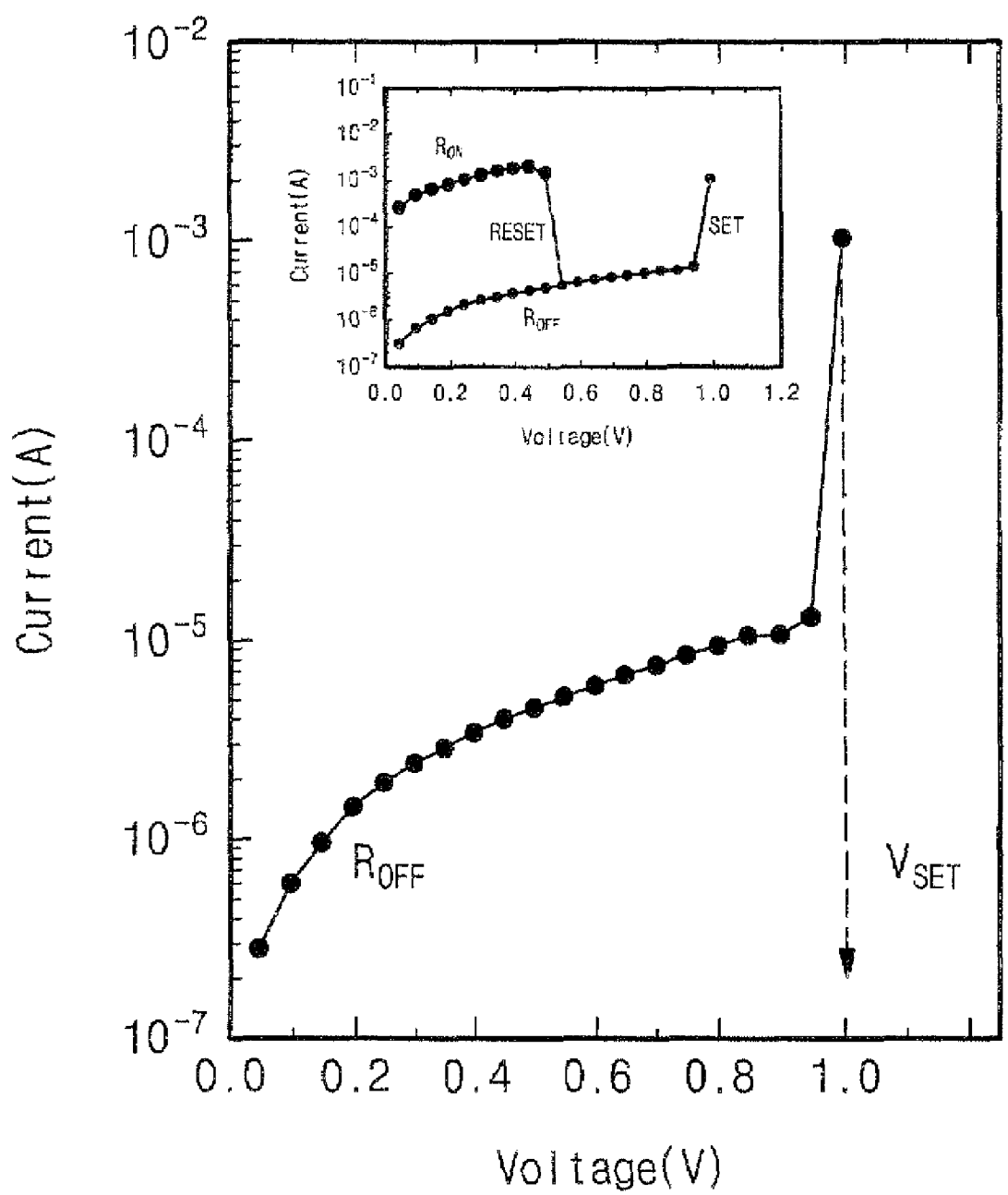
FIG. 1 shows an I-V curve illustrating a resistive switching characteristic of a binary metal oxide memory element, according to one embodiment, having a voltage bias applied thereto.

Embodiments of the present invention will now be exemplarily described more fully hereinafter with reference to the accompanying drawings. These embodiments described herein, however, may be realized in many different forms and should not be construed as being limited to the description set forth herein. Rather, these embodiments are provided so that this disclosure will be thorough and complete, and will fully convey the scope of the claimed invention to those skilled in the art.

Exemplary embodiments described herein can be characterized as being directed to memory capable of storing information on basis of resistance. For example, embodiments exemplarily described herein can be characterized as being directed to a memory element (i.e., a resistive memory element) including a material with an electrical resistance is variable in accordance with an applied electrical signal. Embodiments exemplarily described herein can be characterized as being directed to a binary metal oxide memory element. Exemplary metals for a binary metal oxide may include nickel, niobium, titanium, zirconium, hafnium, cobalt, iron, copper, zinc, aluminum, manganese, or the like, or combinations thereof. A binary metal oxide according to embodiments of the present invention is able to store binary information or multi-bit information. For example, when the memory element stores binary information, a high resistive state may represent logic '0' while a low resistive state represent logic '1'. When the memory element stores multi-bit information, different resistive levels thereof represent different logical values. The metal oxide memory element can also include a metal oxide material such as that exemplarily described in U.S. patent application Ser. No. 11/419,986, filed on May 23, 2006, and Korean Patent Application No. 2005-43124, filed on Mar. 23, 2005, the entire contents of both of which are hereby incorporated by reference.

In one embodiment, the binary metal oxide may store binary information under a voltage bias condition. In another embodiment, the binary metal oxide may store multi-bit information under a current bias condition.

In some embodiments, the binary metal oxide is reversibly switchable between a reset state with high resistance and a set state with low resistance. In other embodiment, the binary metal oxide is reversibly switchable within the reset state and multiple other resistive states (e.g., resistive states including the set state and intermediate resistive states between the reset and set states).

In one example, a set voltage turns the binary metal oxide to the set state from the reset state (program operation) while a reset voltage turns the binary metal oxide to the reset state from the set state (erasure operation). In another example, a set current pulse switches the binary metal oxide into the set state or an intermediate resistive state from the reset state. Accordingly, the binary metal oxide is switchable from the reset state into multiple other resistive states that have a resistance lower than the reset state. Further, the binary metal oxide is switchable from the multiple other resistive states into the reset state when the reset voltage is applied thereto.

FIG. 1 shows an I-V curve illustrating a resistive switching characteristic of a binary metal oxide memory element, according to one embodiment, having a voltage bias applied thereto.

The memory element having the resistive switching characteristic shown in FIG. 1 is a nickel oxide film having dimensions of about 0.05 $\mu m^2$ and a current compliance of about 1 mA. In one embodiment, two electrodes are electrically coupled to the memory element. The two electrodes include iridium and have a thickness of about 500 Å. In one embodiment, the nickel oxide film is a deposited film having a thickness of about 200 Å. In another embodiment, the nickel oxide film is formed by depositing a nickel film to a thickness of about 10 Å (e.g., by sputtering), oxidizing the deposited nickel film in an oxygen plasma treatment, and repeating the deposition and oxidizing a desired number of times. The oxygen plasma treatment can be carried out for about 30 seconds under radio frequency power of about 20 W while injecting oxygen gas with a flow rate of about 2 standard cubic centimeter per minute (sccm).

As shown in FIG. 1, two stable resistive states (i.e., the set state $R_{ON}$ and the reset state $R_{OFF}$) appear when a particular voltage level is applied to the nickel oxide film. As the applied voltage level increases to around 0.5V (i.e., the reset voltage), the nickel oxide film switches into the reset state $R_{OFF}$ from the stable set state $R_{ON}$. Switching from the reset state to the set state occurs at an applied voltage level of about 1V (i.e., the set voltage). When switching between the two stable resistive states by the aforementioned voltage bias conditions, it can be desirable to regulate current rates because the current abruptly increases under the set voltage. The binary metal oxide is switchable into the low resistance set state or the high resistance reset state by properly applying the set or reset voltage thereto, which enables a single-bit memory device to be implemented. For instance, the low resistance set state may correspond to logic '1' while the high resistance reset state may correspond to logic '0'.

While not wishing to be bound by any particular theory, it appears as though the switching mechanism between the set state and reset state is associated with the generation and rupture of one or more filamentary current paths within the binary metal oxide. For example, it appears that the set voltage causes impurities to generate filamentary current paths within the binary metal oxide while the reset voltage removes the filamentary current paths. Thus, if the number, size, and rupture of the filamentary current paths can be controlled when the binary metal oxide is switched into the set state $R_{ON}$ from the reset state $R_{OFF}$, then the binary metal oxide can be switched into multiple set states with various levels of resistance (i.e., various resistive states). Accordingly, when the number of the filamentary current paths is controllable by a voltage signal applied thereto, a multi-bit memory device can be formed.

According to numerous embodiments described herein, discontinuous levels of resistance can be obtained by varying the size of current pulses applied to the binary metal oxide. Thus, properly regulated current pulses can be helpful for making the binary metal oxide conditioned in correspondent resistive state among the multi-resistive states. In one example, at least one intermediate resistive state between the reset state $R_{OFF}$ and set state $R_{ON}$ can be established using voltage bias conditions shown in FIG. 1. Therefore, when a current corresponding to an intermediate resistive state is applied to the binary metal oxide, the binary metal oxide can be switched into the intermediate resistive state and can be further switchable into the multi-level set states from the reset state. Further, the binary metal oxide can be switched into the multi-resistive states based on multi-level current pulses.

Figure 2:
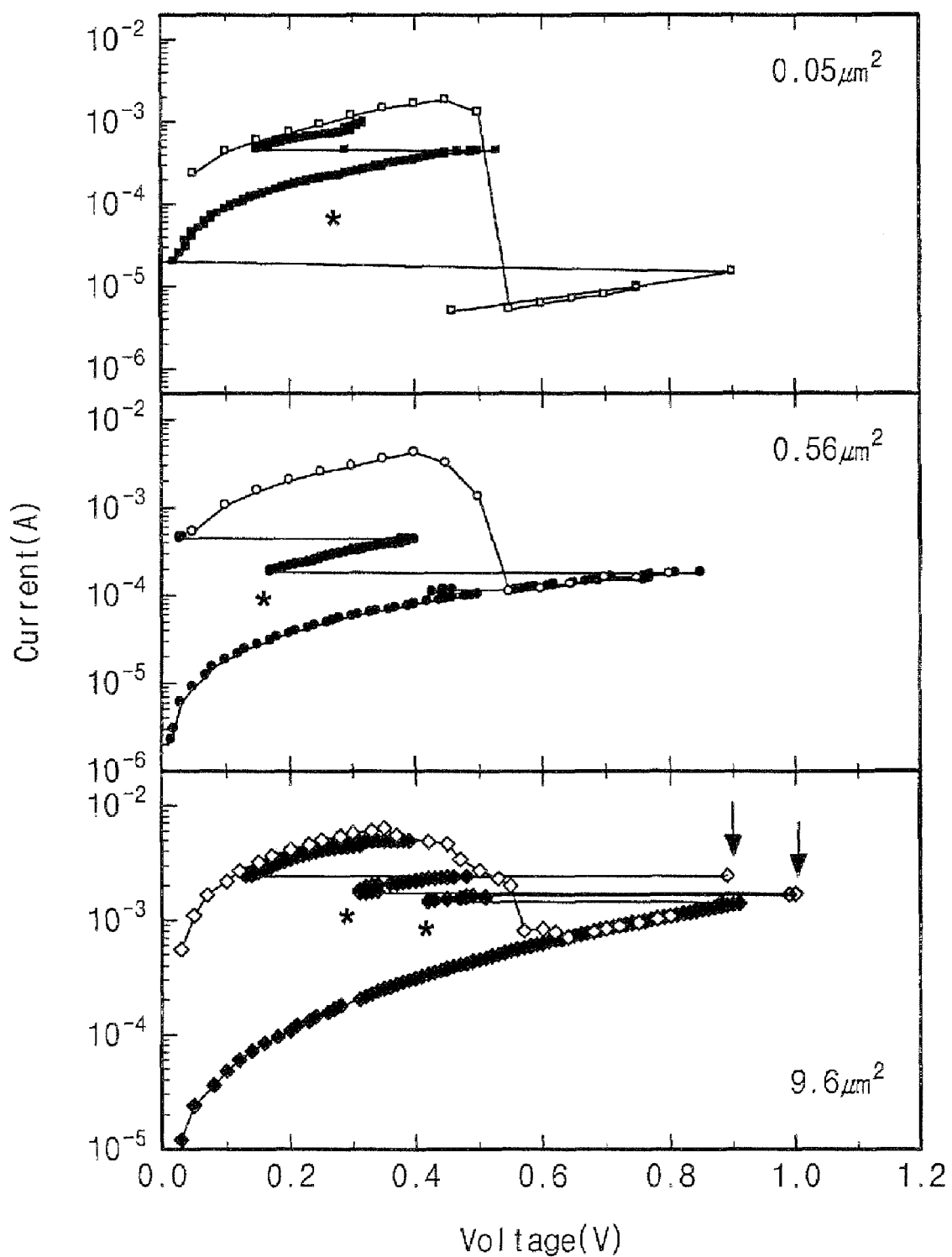
FIG. 2 shows I-V curves illustrating resistive switching characteristics of binary metal oxide memory elements of various sizes having a current bias applied thereto.

FIG. 2 shows I-V curves illustrating resistive switching characteristics of binary metal oxide memory elements of various sizes having a current bias applied thereto. Specifically, FIG. 2 illustrates resistive switching characteristics of nickel oxide memory elements of various sizes (i.e., various areas of 0.05 $\mu m^2$, 0.56 $\mu m^2$ and 9.6 $\mu m^2$).

Referring to FIG. 2, the filled dots form the I-V curves by current bias conditions, while vacant dots form the I-V curves by voltage bias conditions. As shown, at least one intermediate resistive state (noticed by star marks) was generated between the set and reset states regardless of the dimensions of the nickel oxide memory element. These intermediate resistive states are generated when a voltage applied thereto rises over the set voltage of the voltage bias conditions shown in FIG. 1 and then disappear when a current rate is over a predetermined threshold current (i.e., set current; $I_{set}$). As measured, the threshold current $I_{set}$ is about 0.5 mA for the nickel oxide film of 0.05 $\mu m^2$, about 1 mA for the nickel oxide film of 0.56 $\mu m^2$, and about 4 mA for the nickel oxide film of 9.6 $\mu m^2$. Based on these values, one can deduce that the intermediate resistive states are not heavily affected by the dimensions of the memory element. Thus, when a current pulse smaller than the threshold current $I_{set}$ in current rate is applied to the memory element, the memory element may be conditioned in an intermediate resistive state.

Based on the resistive characteristics shown in FIG. 2, one can deduce that the number of the filamentary current paths relevant to switching of resistive states is variable based upon the dimensions of the memory element and the set current $I_{set}$. For example, as the current rate increases and the size of the memory element increases, the number of the filamentary current paths increases. Therefore, the number of the filamentary current paths can be adjusted to make the memory element have a desired level of resistance by regulating the rate of the set current $I_{set}$. For example, if the set state is divided into three intermediate resistive states, the resistive states can be differentiated such that the reset state represents logic '00', a first set state lower than the reset state in resistance represents logic '01', a second set state lower than the first set state in resistance represents logic 10', and a third set state lower than the second set state in resistance represents logic '11'. Accordingly, a memory device incorporating a memory element such as that described above is able to store a 2-bit word or 2-level data.

In one embodiment, the filamentary current paths may be generated at a current rate lower than, for example, the set current $I_{set}$ and at the set voltage established by the voltage bias scheme shown in FIG. 1. A first filamentary current path may be incompletely formed and an additional filamentary current path may be continuously formed around the first filamentary current path by local Joule heating with high current density. Thereby, intermediate resistive states can be generated. As a current rate approaches the set current $I_{set}$, the filamentary current path becomes more stable with the current bias condition and the memory element achieves a set state.

Figure 3:
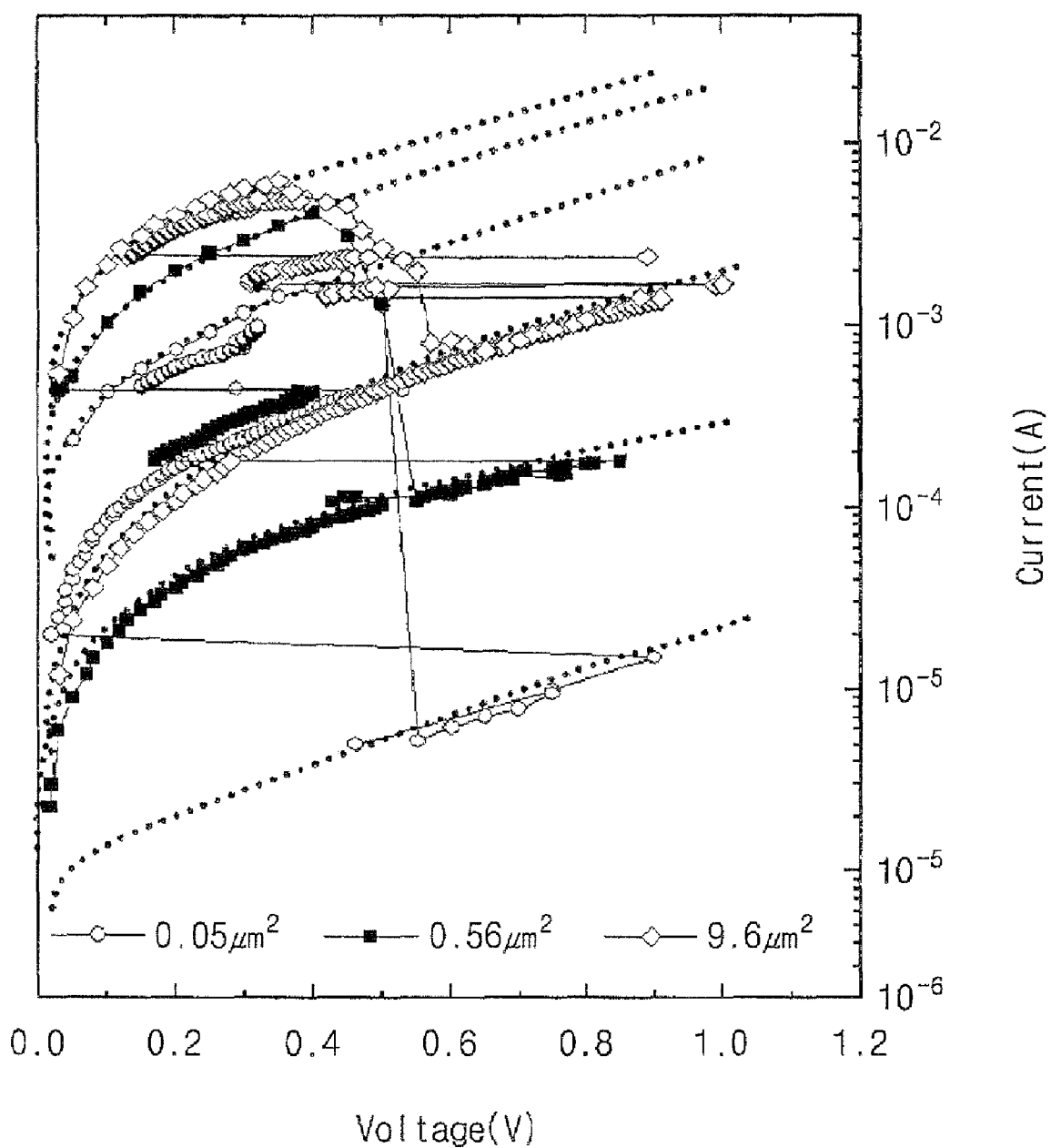
FIG. 3 shows the I-V curves of FIG. 2 superimposed within the same graph.

FIG. 3 shows the I-V curves of FIG. 2 superimposed within the same graph.

As shown in FIG. 3, the I-V curves (i.e., the resistive states), overlap with each other. Thus, one can deduce that the filamentary current paths are generated in a specific pattern to have similar resistances, as opposed to random patterns, while applying a current pulse to the memory element. As a result, the set current $I_{set}$ for making the memory element conditioned in the intermediate resistive state can be obtained.

Switching operations of the memory element into the reset state from the set and intermediate states can be accomplished by applying a voltage thereto. This voltage may be the reset voltage provided according to the voltage bias conditions shown in FIG. 1. Using the reset voltage with a predetermined level, the memory element switches into the reset state regardless of resistance level of the set state. It can be estimated that the reset voltage causes the filamentary current path to disappear, thereby causing the memory element to switch into a reset state of high resistance. It is understood that the reason why the filamentary current path disappears by the reset voltage is because heat generated by the reset current ruptures the filamentary current path within the memory element. During a read operation, information is read out from the memory element without changing the state of the resistive memory element. For example, information is read out from the resistive memory element by applying a read voltage that is lower than the reset voltage.

Figure 4A:
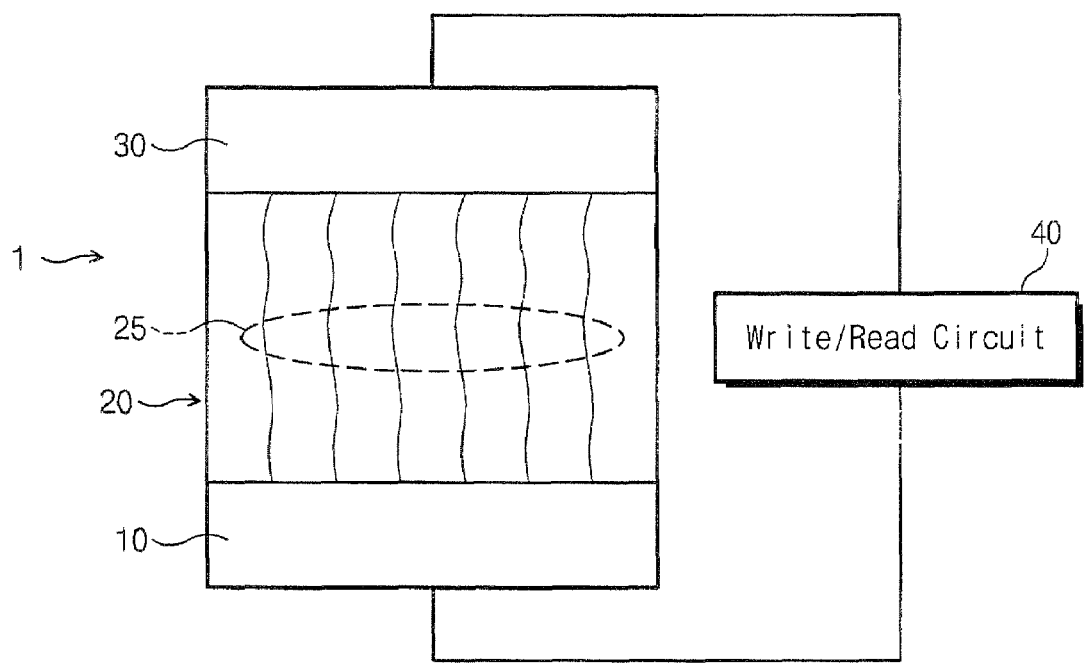
FIG. 4A schematically illustrates an exemplary embodiment of a resistive memory cell.
Figure 4B:
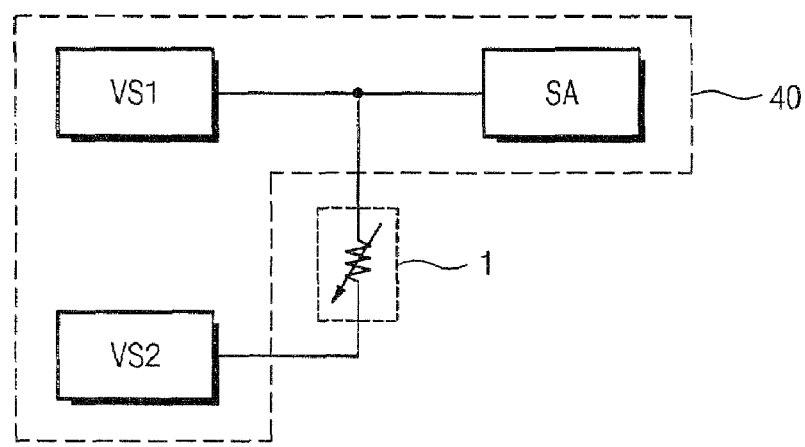
FIG. 4B schematically illustrates an exemplary embodiment of the read/write circuit shown in FIG. 4A.

FIG. 4A schematically illustrates one exemplary embodiment of a resistive memory cell. FIG. 4B schematically illustrates one exemplary embodiment of the read/write circuit shown in FIG. 4A.

Referring to FIG. 4A, a resistive memory cell 1 may, for example, include a resistive memory element 20 interposed between a first and second electrodes 10 and 30, respectively. The first and second electrodes 10 and 30 may be coupled to a write/read circuit 40.

In one embodiment, the write/read circuit 40 contains circuitry adapted to provide the first and second electrodes 10 and 30 of the memory cell 1 with currents and voltage for switching resistive states, and with a voltage for reading. For example, and as exemplarily illustrated in FIG. 4B, the write/ read circuit 40 may include first and second voltage generators, VS1 and VS2, respectively, and a sense amplifier SA.

In one embodiment, the first and second voltage generators, VS1 and VS2 may supply different voltages to the first and second electrodes 10 and 30 of the resistive memory cell 1 during a write operation. In another embodiment, the sense amplifier SA may detect a current flowing through the resistive memory element 20. The resistive memory cell 1 may be connected to the first and second voltage generators VS1 and VS2 and the sense amplifier SA through predetermined interconnections (e.g., word and bit lines). An interconnection structure for the resistive memory cell 1 may be variable in various patterns. For example, the resistive memory cell 1 may be configured as described in U.S. patent application Ser. No. 11/378,945, filed on Mar. 17, 2006, and Korean Patent Application No. 2005-25561, filed on Mar. 28, 2005, the entire contents of both of which are hereby incorporated by reference.

Returning to FIG. 4A, when in the set state, the resistive memory element 20 includes a plurality of filamentary current paths 25 that electrically connect the first and second electrodes 10 and 30 with each other. These filamentary current paths 25 continue to exist even when no electrical signal is applied to the first and second electrodes 10 and 30 (i.e., even after a current is shut off), thereby allowing the memory cell 1 to operate as a nonvolatile device. The number of the filamentary current paths 25 is dependent on a pulse size of the set current applied to the memory element 20 through the two electrodes 10 and 30. As the set current becomes larger, the number of the filamentary current paths increases to reduce resistance of the resistive memory element 20. When a voltage is applied to the first and second electrodes 10 and 30, the filamentary current paths 25 disappear.

In one embodiment, the first and second electrodes 10 and 30 may include materials such as noble metals (e.g., iridium, platinum, ruthenium, etc.), polysilicon, tungsten, or combinations thereof, or the like.

In one embodiment, switching from the set states to the reset state may be accomplished by applying the reset voltage with same polarity as the reset current, to the memory element 20 through the first and second electrodes 10 and 30. In one embodiment, the reset voltage can be characterized as having a level sufficient to remove the filamentary current paths (e.g., about 0.4V through about 0.8V). In the meantime, a read operation for detecting a resistive state of the memory cell 1 may be accomplished by applying a read voltage to the memory element 20 through the first and second electrodes 10 and 30. In one embodiment, the read voltage is smaller than the reset voltage and in the same polarity as the reset voltage.

In one embodiment, one of the first and second electrodes 10 and 30 can be coupled to a selection element (not shown) for designating the memory element 20, while the other of the first and second electrodes 10 and 30 can be coupled to a bit line (not shown) for transferring information from the memory element 20. The selection element may include, for example, a transistor or diode. In one embodiment, a diode may be used as the selection element rather than a transistor if the set current and the reset voltage have the same polarity.

Figure 5:
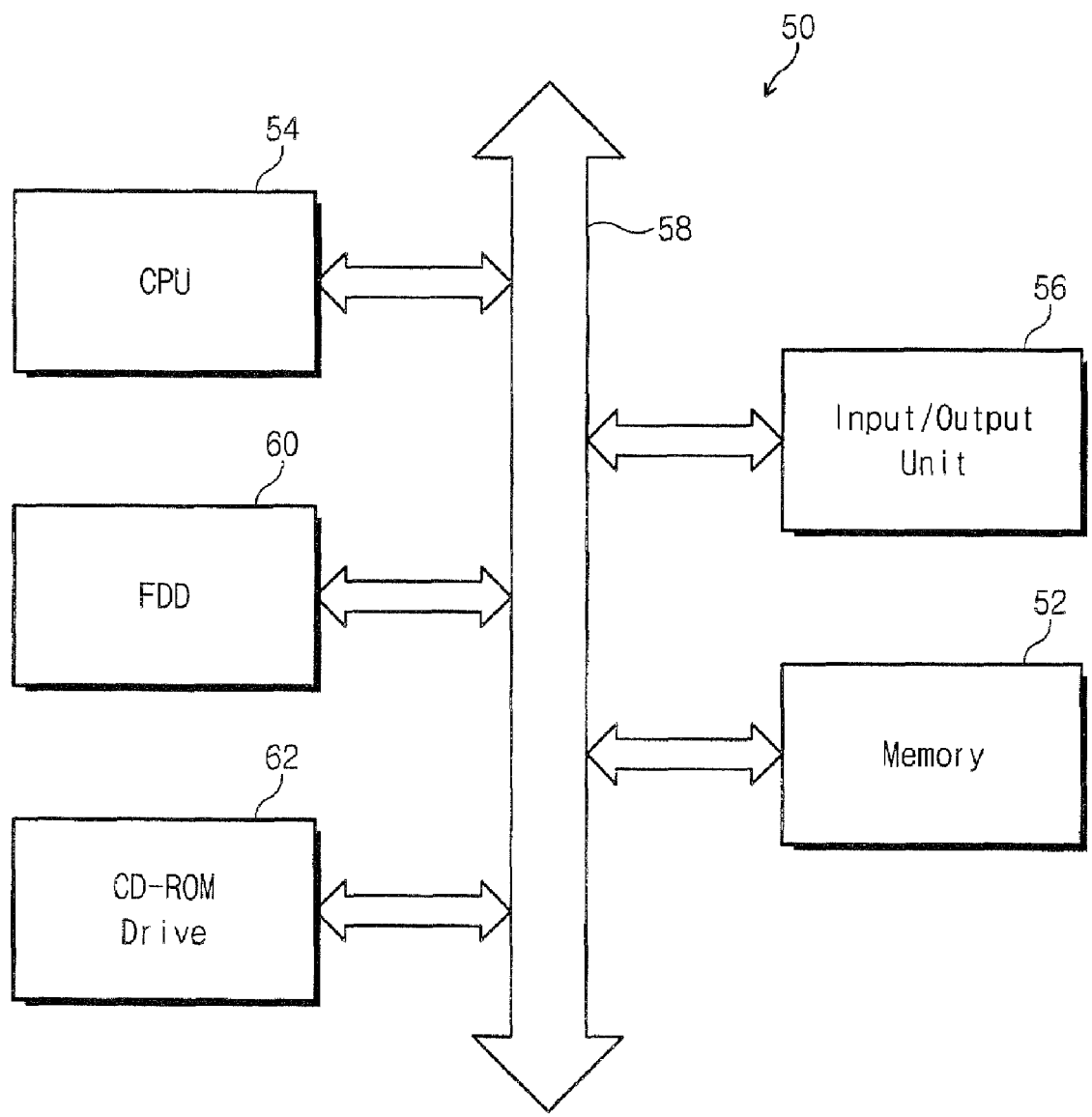
FIG. 5 schematically illustrates an exemplary processor-based data processing system employing a memory with the resistive memory cell according to embodiments described herein.

FIG. 5 schematically illustrates an exemplary processor-based data processing system employing a memory with the resistive memory cell according to embodiments described herein.

Referring to FIG. 5, an exemplary data processing system 50 may include a central processing unit (CPU) 54 such as a microprocessor, a digital signal processor or another programmable digital logic device, in communication with an input/output unit 56 via a bus 58.

When the data processing system 50 is a kind of computer system, a floppy disk drive (FDD) 60 and a CD-ROM drive 62 may be included as peripheral devices that communicate with the CPU 54 via the bus 58. A memory 52 may be provided that communicates with the data processing system 50 through a memory controller (not shown). The memory 52 may include one or more resistive memory elements as described above. If necessary, the memory 52 may be embedded within a single integrated circuit along with the CPU 54.

According to numerous embodiments, the reset voltage, the set current, and the read voltage (herein collectively referred to as "driving signals") have the same polarity and a driving circuit is structured and driving voltages are operable in lower levels. Moreover, because diodes may be used to select particular memory elements (e.g., when the driving signals have the same polarity), the degree with which the memory device can be integrated with other devices can be increased (e.g., as compared with the use of transistors to select particular memory elements).

Although embodiments of the present invention have been exemplarily described in connection with the accompanying drawings, they are not limited thereto. It will be apparent to those skilled in the art that various substitutions, modifications and changes may be made thereto without departing from the scope and spirit of the claimed invention.

What is claimed is:

1. A memory element of a multi-bit memory cell, the memory element comprising:
    a metal oxide film, wherein a resistance of the metal oxide film is switchable from a first resistive state to a corresponding one of a plurality of other resistive states in response to a current applied thereto, and wherein a resistance of the first resistive state is higher than a resistance of each of the plurality of other resistive states,
    wherein the memory cell is switchable from the corresponding one of the plurality of other resistive states to the first resistive state in response to an applied voltage, and
    wherein a polarity of the applied current with respect to a direction perpendicular to a plane of the metal oxide film is the same as a polarity of a current generated by the applied voltage with respect to said direction perpendicular to the plane of the metal oxide film.

2. The memory element of claim 1, wherein the metal oxide film comprises a binary metal oxide film.

3. The memory element of claim 1, wherein a metal of the metal oxide film comprises nickel, niobium, titanium, zirconium, hafnium, cobalt, iron, copper, zinc, aluminum, or manganese, or combinations thereof.

4. A multi-bit memory cell, comprising:
    a memory element, wherein a resistance of the memory element is switchable from a first resistive state to a corresponding one of a plurality of other resistive states in response to a current applied thereto, and wherein a resistance of the first resistive state is higher than a resistance of each of the plurality of other resistive states, and wherein the memory element comprises metal oxide;
    a first electrode;
    and a second electrode,
    wherein the first and second electrodes are adapted to apply the current to the memory element,
    wherein the memory cell is switchable from the corresponding one of the plurality of other resistive states to the first resistive state in response to an applied voltage, and
    wherein a polarity of the applied current with respect to a direction perpendicular to a plane of the metal oxide between the first electrode and the second electrode is the same as a polarity with respect to said direction perpendicular to the plane of the metal oxide of a current generated by the applied voltage between the first electrode and the second electrode.

5. The multi-bit memory cell of claim 4, wherein the metal oxide comprises a binary metal oxide film.

6. The multi-bit memory cell of claim 4, wherein a metal of the metal oxide comprises nickel, niobium, titanium, zirconium, hafnium, cobalt, iron, copper, zinc, aluminum, or manganese, or combinations thereof.

7. The multi-bit memory cell of claim 4, wherein at least one of the first and second electrodes comprises a noble metal, polysilicon, tungsten, or combinations thereof.

8. The multi-bit memory cell of claim 4, further comprising circuitry coupled to the first and second electrodes, the circuitry being adapted to provide the first and second electrodes with current and voltage for switching between the first resistive state and the plurality of other resistive states.

9. The multi-bit memory cell of claim 4, further comprising a sense amplifier coupled to one of the first and second electrodes, the sense amplifier adapted to detect a current flowing through the memory element.

10. A multi-bit memory cell, comprising:
    a metal oxide film, wherein a resistance of the metal oxide film is switchable from a first resistive state to a corresponding one of a plurality of other resistive states in response to a current applied thereto, and wherein the metal oxide film is switchable from the corresponding one of the plurality of other resistive states to the first resistive state in response to an applied voltage, and wherein a resistance of the first resistive state is higher than a resistance of each of the plurality of other resistive states;
    a first electrode; and
    a second electrode,
    wherein the first and second electrodes are adapted to apply the current to the metal oxide film, and
    wherein a polarity of the applied current with respect to a direction perpendicular to a plane of the metal oxide film between the first electrode and the second electrode is the same as a polarity of a current with respect to said direction perpendicular to the plane of the metal oxide film generated by the applied voltage between the first electrode and the second electrode.

11. The multi-bit memory cell of claim 10, wherein the metal oxide film comprises a binary metal oxide film.

12. The multi-bit memory cell of claim 10, wherein a metal of the metal oxide film comprises nickel, niobium, titanium, zirconium, hafnium, cobalt, iron, copper, zinc, aluminum, or manganese, or combinations thereof.

13. The multi-bit memory cell of claim 10, wherein at least one of the first and second electrodes comprises a noble metal, polysilicon, tungsten, or combinations thereof.

14. A method of operating a multi-bit memory cell, the method comprising:
    applying a current to a metal oxide of a memory cell, the applied current sufficient to switch a resistance of the metal oxide of the memory cell from a first resistive state to a corresponding one of a plurality of other resistive states, wherein a resistance of the first resistive state is higher than a resistance of each of the plurality of other resistive states; and applying a reset voltage to the metal oxide of the memory cell sufficient to switch the resistance of the metal oxide of the memory cell from the corresponding one of the plurality of other resistive states to the first resistive state, wherein a polarity of the applied current with respect to a direction perpendicular to a plane of the metal oxide of the memory cell is the same as a polarity of a current generated by the reset voltage with respect to said direction perpendicular to the plane of the metal oxide of the memory cell.

15. The method of claim 14, wherein the metal oxide comprises a binary metal oxide film.

16. The method of claim 14, further comprising applying a read voltage to the metal oxide of the memory cell, the read voltage having a voltage lower than the reset voltage and being sufficient to read information from the metal oxide memory cell.

17. The method of claim 14, wherein applying the current comprises generating at least one filamentary current through the metal oxide of the memory cell, wherein the number of filamentary currents generated corresponds to a magnitude of the applied current.

* * * * *